United States Patent
Nobe et al.

(10) Patent No.: US 10,958,091 B2
(45) Date of Patent: Mar. 23, 2021

(54) POWER SUPPLY DEVICE

(71) Applicant: TOYOTA JIDOSHA KABUSHIKI KAISHA, Toyota (JP)

(72) Inventors: Daigo Nobe, Toyota (JP); Shohei Oi, Toyota (JP); Atsushi Nomura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 28 days.

(21) Appl. No.: 16/152,582

(22) Filed: Oct. 5, 2018

(65) Prior Publication Data
US 2019/0109529 A1    Apr. 11, 2019

(30) Foreign Application Priority Data
Oct. 6, 2017 (JP) .................................. 2017-195972

(51) Int. Cl.
| | |
|---|---|
| *H02J 7/00* | (2006.01) |
| *H02M 1/00* | (2006.01) |
| *H02M 7/539* | (2006.01) |
| *G01R 35/00* | (2006.01) |
| *G01R 19/10* | (2006.01) |
| *B60L 58/24* | (2019.01) |
| *H02M 3/155* | (2006.01) |
| *B60L 50/51* | (2019.01) |
| *H02M 1/32* | (2007.01) |

(52) U.S. Cl.
CPC ............ *H02J 7/0063* (2013.01); *B60L 58/24* (2019.02); *G01R 19/10* (2013.01); *G01R 35/00* (2013.01); *H02M 1/00* (2013.01); *H02M 3/155* (2013.01); *H02M 7/539* (2013.01); *B60L 50/51* (2019.02); *B60L 2210/40* (2013.01); *H02M 2001/0009* (2013.01); *H02M 2001/0048* (2013.01); *H02M 2001/322* (2013.01)

(58) Field of Classification Search
CPC ....................................................... H02J 7/0063
USPC ........................................................... 320/112
See application file for complete search history.

(56) References Cited

U.S. PATENT DOCUMENTS

| | | | | |
|---|---|---|---|---|
| 2011/0169448 A1* | 7/2011 | Ichikawa | ................ | B60L 58/12 |
| | | | | 320/109 |
| 2013/0271077 A1* | 10/2013 | Kim | ........................ | H02J 7/022 |
| | | | | 320/109 |
| 2017/0225571 A1 | 8/2017 | Jojima | | |

FOREIGN PATENT DOCUMENTS

| | | |
|---|---|---|
| CN | 104158211 A | 11/2014 |
| CN | 107070208 A | 8/2017 |
| JP | 2017-079558 A | 4/2017 |

* cited by examiner

*Primary Examiner* — Eric D Lee
(74) *Attorney, Agent, or Firm* — Sughrue Mion, PLLC

(57) ABSTRACT

A power supply device comprises a first boost converter configured to transmit electric power with conversion of a voltage between an electric load side and a power storage device side; a second boost converter connected in parallel to the first boost converter relative to an electric load and configured to transmit electric power with conversion of a voltage between the electric load side and the power storage side; and a control device configured to control the first boost converter and the second boost converter. At a predetermined time, the control device performs a loop current control that controls the first boost converter and the second boost converter such that a loop current flows in a closed circuit including the first boost converter and the second boost converter.

8 Claims, 5 Drawing Sheets

POWER SUPPLY DEVICE

CROSS-REFERENCE TO RELATED APPLICATIONS

The present disclosure claims priority to Japanese Patent Application No. 2017-195972 filed Oct. 6, 2017, which is incorporated herein by reference in its entirety including specification, drawings and claims.

TECHNICAL FIELD

The present disclosure relates to a power supply device and more specifically relates to a power supply device including a plurality of boost converters that are connected in parallel to each other and that are configured to transmit electric power with conversion of a voltage between an electric load side and a power storage device side.

BACKGROUND

A proposed configuration of a power supply device includes a plurality of converters that are connected in parallel to each other and that serve to transmit electric power with conversion of a voltage between an electric load side and a power storage device side (as described in, for example, JP 2017-79558A). When the electric current generated in the process of a boosting operation using a first boost converter alone is higher than a limit value of the first boost converter, this power supply device performs a boosting operation by using both the first boost converter and a second boost converter. When the electric current generated in the process of the boosting operation using the first boost converter alone is lower than the limit value of the first boost converter, on the other hand, this power supply device performs a boosting operation such as to provide the smaller loss between a loss in the case of a boosting operation that is performed by using the first boost converter alone and a loss in the case of a boosting operation that is performed by using both the first boost converter and the second boost converter at a power distribution ratio that is based on a ratio of circuit resistance values of the first boost converter and the second boost converter.

SUMMARY

The power supply device described above controls the plurality of boost converters such as to reduce an overall loss of the respective boost converters. The above power supply device takes no consideration of a control of the respective boost converters such that a loop current flows in a closed circuit including at least two boost converters among the plurality of boost converters, since such a control increases the overall loss. There may be, however, a need to cause the loop current to flow in the closed circuit including two boost converters, according to some state of a system which the power supply device is built in.

A power supply device of the present disclosure mainly aims to enable a loop current to flow in a closed circuit including two boost converters as needed basis, based on the state of a system which the power supply device is built in.

In order to achieve the above primary object, the power supply device of the present disclosure employs the following configuration.

The present disclosure is directed to a power supply device. The power supply device includes a power storage device, a first boost converter configured to transmit electric power with conversion of a voltage between an electric load side and a power storage device side, a second boost converter connected in parallel to the first boost converter relative to an electric load and configured to transmit electric power with conversion of a voltage between the electric load side and the power storage side, a first capacitor placed on the power storage device side of the first boost converter and the second boost converter, a second capacitor placed on the electric load side of the first boost converter and the second boost converter, and a control device configured to control the first boost converter and the second boost converter. At a predetermined time, the control device performs a loop current control that controls the first boost converter and the second boost converter such that a loop current flows in a closed circuit including the first boost converter and the second boost converter.

In the power supply device of this aspect, the first boost converter and the second boost converter connected in parallel to each other relative to the electric load serve to transmit electric power with conversion of a voltage between the electric load side and the power storage device side. At the predetermined time, the power supply device of this aspect performs the loop current control that controls the first boost converter and the second boost converter such that the loop current flows in the closed circuit including the first boost converter and the second boost converter. This configuration enables the loop current to flow in the closed circuit including the two boost converters as needed basis, based on the state of a system which the power supply device is built in.

DESCRIPTION OF EMBODIMENTS

Figure 1:
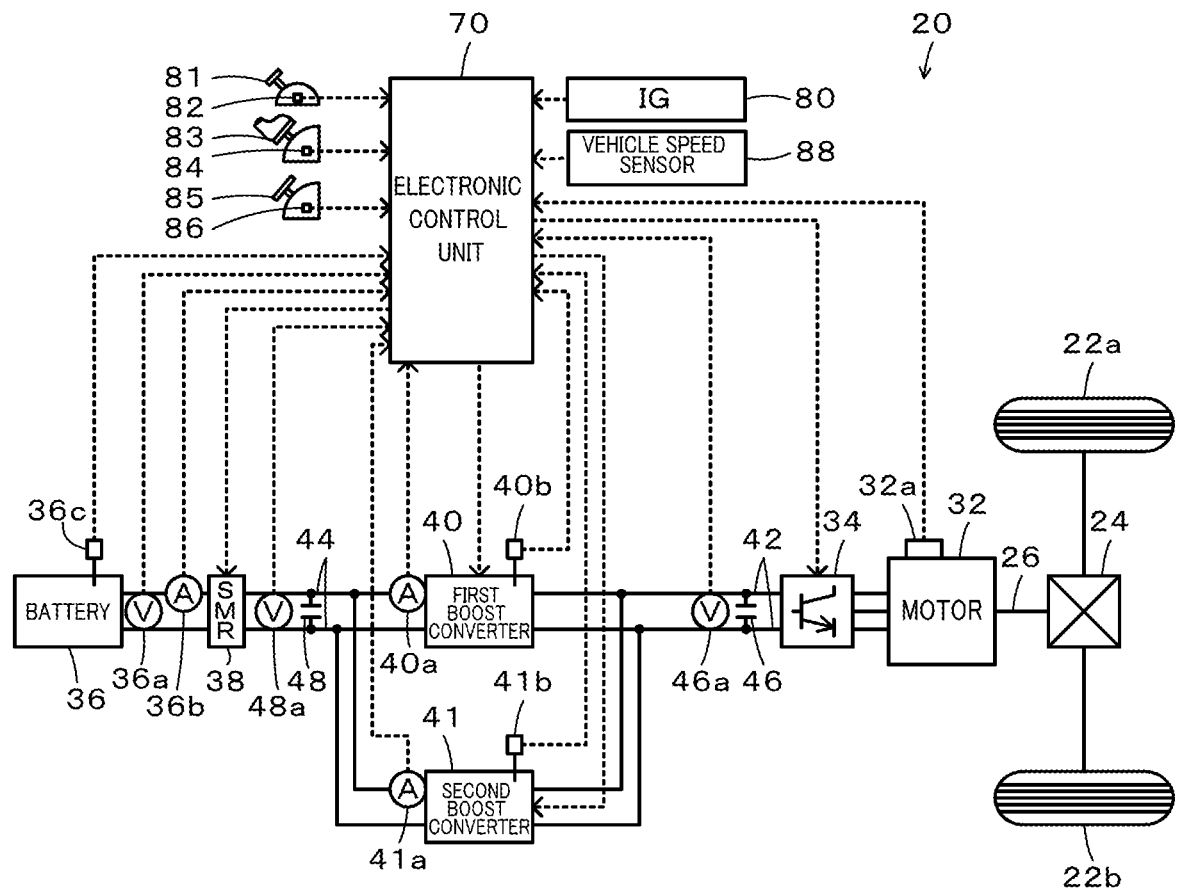
FIG. 1 is a configuration diagram illustrating the schematic configuration of an electric vehicle with a power supply device according to one embodiment of the present disclosure mounted thereon.
Figure 2:
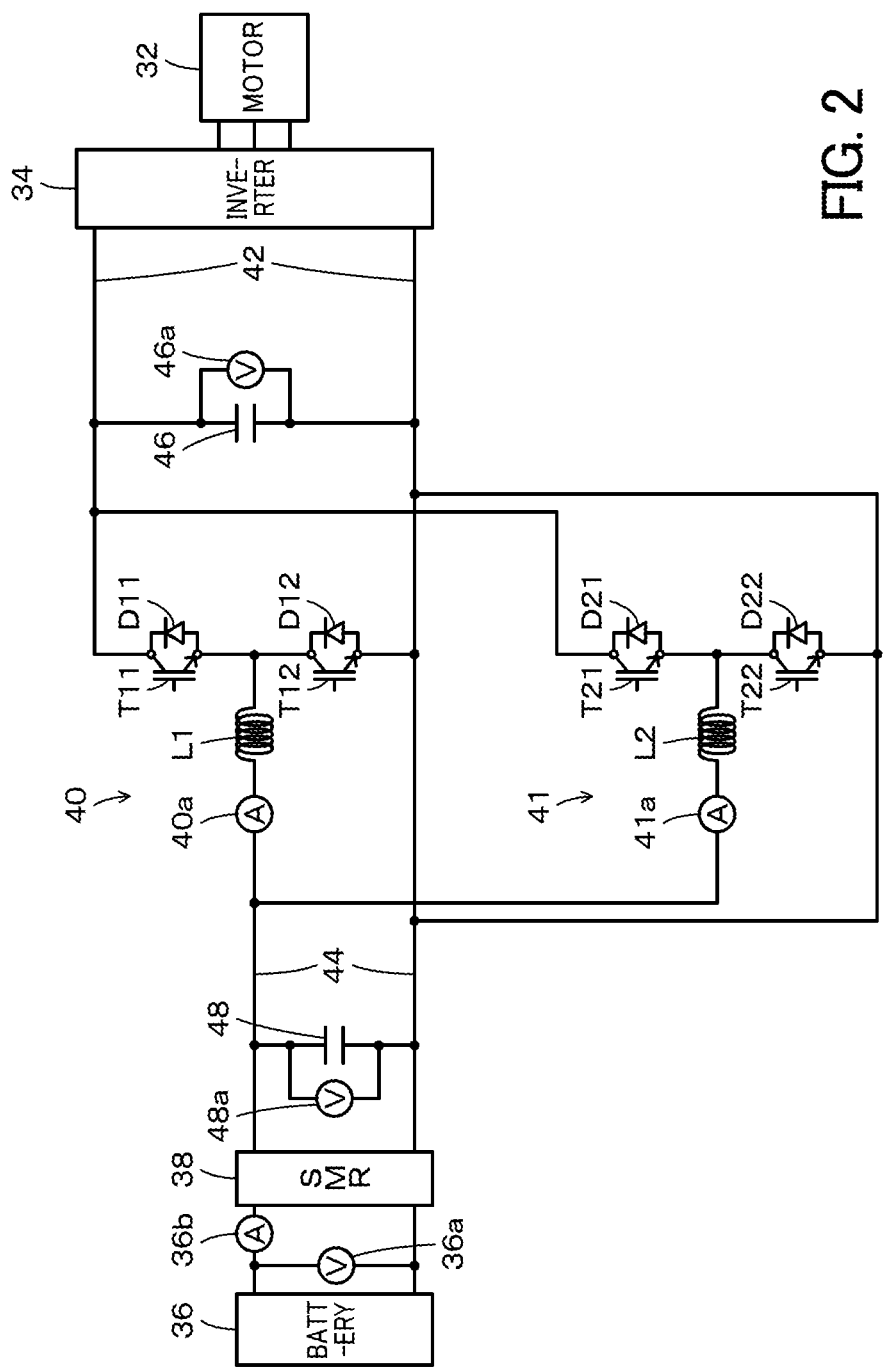
FIG. 2 is a configuration diagram illustrating the schematic configuration of an electric drive system including a motor.

The following describes some aspects of the present disclosure with referring to an embodiment. FIG. 1 is a configuration diagram illustrating the schematic configuration of an electric vehicle 20 with a drive device according to one embodiment of the present disclosure mounted thereon. FIG. 2 is a configuration diagram illustrating the schematic configuration of an electric drive system including a motor 32. As shown in FIG. 1, the electric vehicle 20 of the embodiment includes a motor 32, an inverter 34, a battery 36 as a power storage device, first and second boost converters 40 and 41, and an electronic control unit 70. The battery 36, the first and second boost converters 40 and 41 and the electronic control unit 70 correspond to the drive device according to the embodiment.

The motor 32 is configured as, for example, a synchronous generator motor and includes a rotor connected with a driveshaft 26 that is coupled with drive wheels 22a and 22b via a differential gear 24. The inverter 34 is connected with the motor 32 and with high voltage-side power lines 42. The electronic control unit 70 performs switching control of a plurality of switching elements (not shown) included in the inverter 34, so as to rotate and drive the motor 32. A capacitor 46 for smoothing is mounted to a positive electrode line and a negative electrode line of the high voltage-side power lines 42.

The battery 36 is configured as, for example, a lithium ion rechargeable battery or a nickel metal hydride battery and is connected with low voltage-side power lines 44 as second power lines. A system main relay 38 configured to connect and disconnect the battery 36 and a capacitor 48 for smoothing are mounted in this sequence from the battery 36-side to a positive electrode line and a negative electrode line of the low voltage-side power lines 44.

As shown in FIG. 2, the first boost converter 40 is connected with the high voltage-side power lines 42 and with the low voltage-side power lines 44 and is configured as a known step-up/down converter including two transistors T11 and T12, two diodes D11 and D12 and a reactor L1. The transistor T11 is connected with the positive electrode line of the high voltage-side power lines 42. The transistor T12 is connected with the transistor T11 and with the negative electrode lines of the high voltage-side power lines 42 and of the low voltage-side power lines 44. The reactor L1 is connected with a connection point between the transistors T11 and T12 and with the positive electrode line of the low voltage-side power lines 44. The electronic control unit 70 regulates the rate of ON time of the transistors T11 and T12 of the first boost converter 40, so that the first boost converter 40 supplies the power of the low voltage-side power lines 44 to the high voltage-side power lines 42 with stepping up the voltage of the power, while supplying the power of the high voltage-side power lines 42 to the low voltage-side power lines 44 with stepping down the voltage of the power.

The second boost converter 41 is configured as a boost converter having the same performance as that of the first boost converter 40 within a manufacturing error and the like. More specifically, like the first boost converter 40, the second boost converter 41 is connected with the high voltage-side power lines 42 and with the low voltage-side power lines 44 and is configured as a known step-up/down converter including two transistors T21 and T22, two diodes D21 and D22 and a reactor L2. The electronic control unit 70 regulates the rate of ON time of the transistors T21 and T22 of the second boost converter 41, so that the second boost converter 41 supplies the power of the low voltage-side power lines 44 to the high voltage-side power lines 42 with stepping up the voltage of the power, while supplying the power of the high voltage-side power lines 42 to the low voltage-side power lines 44 with stepping down the voltage of the power.

The electronic control unit 70 is configured as a CPU-based microprocessor and includes a ROM configured to store processing programs, a RAM configured to temporarily store data, a non-volatile flash memory and input/output ports, in addition to the CPU, although not being illustrated.

As shown in FIG. 1, signals from various sensors are input into the electronic control unit 70 via the input port. The signals input into the electronic control unit 70 include, for example, a rotational position $\theta m$ from a rotational position detection sensor 32a configured to detect the rotational position of the rotor of the motor 32 and phase currents Iu and Iv from current sensors configured to detect electric currents flowing in the respective phases of the motor 32. The input signals also include a voltage Vb from a voltage sensor 36a mounted between terminals of the battery 36, an electric current Ib from a current sensor 36b mounted to an output terminal of the battery 36, and a battery temperature Tb from a temperature sensor 36c mounted to the battery 36. The input signals additionally include a voltage VH of the high voltage-side power lines 42 (capacitor 46) from a voltage sensor 46a mounted between terminals of the capacitor 46 and a voltage VL of the low voltage-side power lines 44 (capacitor 48) from a voltage sensor 48a mounted between terminals of the capacitor 48. The input signals further include electric currents IL1 and IL2 of the reactors L1 and L2 from current sensors 40a and 40b configured to detect electric currents flowing in the reactors L1 and L2 of the first and the second boost converters 40 and 41 and temperatures tc1 and tc2 of the first and the second boost converters 40 and 41 from temperature sensors 40b and 41b mounted to the first and the second boost converters 40 and 41. The input signals also include an ignition signal from an ignition switch 80 and a shift position SP from a shift position sensor 82 configured to detect an operating position of a shift lever 81. The input signals further include an accelerator position Acc from an accelerator pedal position sensor 84 configured to detect a depression amount of an accelerator pedal 83, a brake pedal position BP from a brake pedal position sensor 86 configured to detect a depression amount of a brake pedal 85, and a vehicle speed V from a vehicle speed sensor 88.

As shown in FIG. 1, various control signals are output from the electronic control unit 70 via the output port. The signals output from the electronic control unit 70 include, for example, switching control signals to the plurality of switching elements included in the inverter 34, switching control signals to the transistors T11 and T12 of the first boost converter 40, switching control signals to the transistors T21 and T22 of the second boost converter 41, and a drive control signal to the system main relay 38. The electronic control unit 70 calculates an electrical angle $\theta e$ and a rotation speed Nm of the motor 32, based on the rotational position $\theta m$ of the rotor of the motor 32 from the rotational position detection sensor 32a.

The electronic control unit 70 calculates a state of charge SOC of the battery 36, based on an integrated value of the electric current Ib of the battery 36 from the current sensor 36b. The electronic control unit 70 also calculates input and output limits Win and Wout that denote maximum allowable powers to be charged into and discharged from the battery 36, based on the calculated state of charge SOC and the battery temperature Tb from the temperature sensor 36c mounted to the battery 36. The state of charge SOC herein denotes a ratio of the capacity of electric power dischargeable from the battery 36 to the overall capacity of the battery 36.

In the electric vehicle 20 of the embodiment having the above configuration, the electronic control unit 70 first sets a required torque Td* that is required for driving (required for the driveshaft 26), based on the accelerator position Acc and the vehicle speed V, and multiplies the required torque Td* by a rotation speed of the driveshaft 26 to set a load power Pm which the motor 32 is required to output for driving. The electronic control unit 70 subsequently sets a torque command Tm* such that the load power Pm is output from the motor 32. The electronic control unit 70 then performs witching control of the switching elements included in the inverter 34, such as to output the torque command Tm*. The electronic control unit 70 also sets a target voltage VH* of the high voltage-side power lines 42, based on the torque command Tm*, and controls the first boost converter 40 and the second boost converter 41 to supply the load power Pm to the inverter 34 with stepping up the voltage of the power from the battery 36 to the target voltage VH*. The first boost converter 40 is controlled to supply a required distributed power P1 to the high voltage-side power lines 42. The second boost converter 41 is controlled to supply a required distributed power P2 to the high voltage-side power lines 42. The required distributed powers P1 and P2 are generally determined such as to minimize losses (power losses) of the first boost converter 40 and the second boost converter 41.

The following describes operations of the power supply device mounted on the electric vehicle 20 of the embodiment having the above configuration or more specifically a series of operations to cause loop current to flow in a closed circuit including the first boost converter 40 and the second boost converter 41. The loop current is made to flow in the closed circuit, for example, in the case where the state of charge SOC of the battery 36 reaches or exceeds a reference value that is close to a full charge level (for example, 80% or 90%) during regenerative control of the motor 32, in the case where the electric vehicle 20 comes into collision, in the case where the temperature of the battery 36 is raised in an extremely low temperature condition, and in the case where a failure diagnosis is made for the current sensors 40a and 41a. These cases are sequentially described below.

Figure 3:
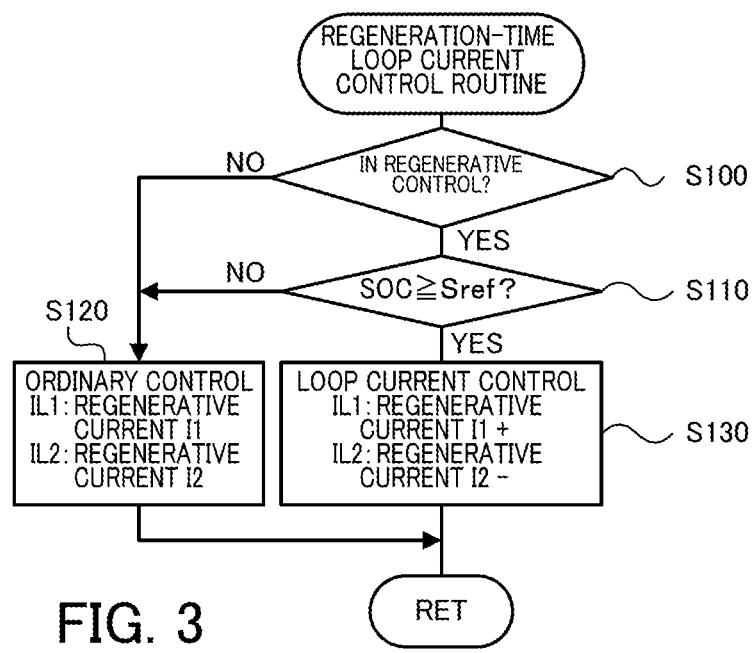
FIG. 3 is a flowchart showing one example of a regeneration-time loop current control routine performed by an electronic control unit.

FIG. 3 is a flowchart showing one example of a regeneration-time loop current control routine performed by the electronic control unit 70 to cause loop current to flow in the case where the state of charge SOC of the battery 36 reaches or exceeds a reference value that is close to a full charge level (for example, 80% or 90%) during regenerative control of the motor 32. This routine is performed repeatedly at every predetermined time interval (for example, at every several msec or at every several ten msec).

When the regeneration-time loop current control routine of FIG. 3 is triggered, the electronic control unit 70 first determines whether the motor 32 is in regenerative control (step S100). This determination is based on whether the torque command Tm* of the motor 32 is a negative value or not. When it is determined that the motor 32 is not in regenerative control, the electronic control unit 70 determines that there is no need to cause a loop current to flow, controls the first boost converter 40 and the second boost converter 41 by ordinary control (step S120) and then terminates this routine. As described above, the ordinary control controls the first boost converter 40 to supply the required distributed power P1 to the high voltage-side power lines 42 and controls the second boost converter 41 to supply the required distributed power P2 to the high voltage-side power lines 42. More specifically, by using the voltage VL of the low voltage-side power lines 44, the ordinary control controls the first boost converter 40 to cause an electric current I1 by dividing the required distributed power P1 by the voltage VL (I1=P1/VL) to be equal to an electric current IL1 flowing in the reactor L1 (reactor current IL1) and controls the second boost converter 41 to cause an electric current I2 by dividing the required distributed power P2 by the voltage VL (I2=P2/VL) to be equal to an electric current IL2 flowing in the reactor L2 (reactor current IL2).

When it is determined at step S100 that the motor 32 is in regenerative control, the electronic control unit 70 subsequently determines whether the state of charge SOC of the battery 36 is equal to or higher than a reference value Sref (step S110). The reference value Sref may be a value close to the full charge level (for example, 80% or 90%) as described above. When it is determined that the state of charge SOC of the battery 36 is lower than the reference value Sref, the electronic control unit 70 determines that there is no need to cause a loop current to flow, performs the ordinary control (step S120) and then terminates this routine. In this case, the ordinary control controls the first boost converter 40 to cause a regenerative current I1 by dividing the required distributed power P1 by the voltage VL (I1=P1/VL) to be equal to the reactor current IL1 and controls the second boost converter 41 to cause a regenerative current I2 by dividing the required distributed power P2 by the voltage VL (I2=P2/VL) to be equal to the reactor current IL2.

Figure 4:
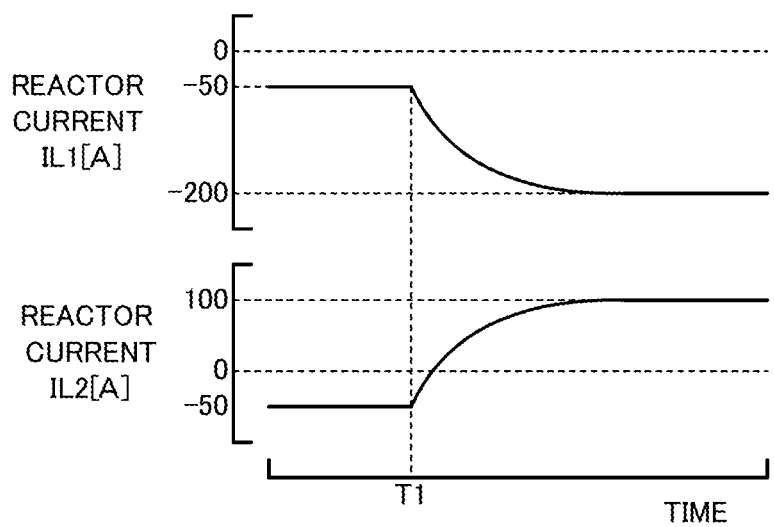
FIG. 4 is a diagram illustrating one example of time changes of reactor currents IL1 and IL2 in the regeneration-time loop current control routine.

When it is determined at step S110 that the state of charge SOC of the battery 36 is equal to or higher than the reference value Sref, the electronic control unit 70 performs control to cause a loop current $\alpha$, in addition to the regenerative currents I1 and I2 in the case of the ordinary control, to flow in the closed circuit including the first boost converter 40 and the second boost converter 41 (step S130) and then terminates this routine. More specifically, the first boost converter 40 is controlled to cause the reactor current IL1 to be equal to a value (I1+$\alpha$) obtained by adding the loop current $\alpha$ to the regenerative current I1 in the case of the ordinary control. This control may be achieved by, for example, feedback control of the duty ratio of the first boost converter 40 to minimize a difference between the current value detected by the current sensor 40a and the value (I1+$\alpha$). The second boost converter 41 is, on the other hand, controlled to cause the reactor current IL2 to be equal to a value (I2−$\alpha$) obtained by subtracting the loop current $\alpha$ from the regenerative current I2 in the case of the ordinary control. This control may be achieved by, for example, feedback control of the duty ratio of the second boost converter 41 to minimize a difference between the current value detected by the current sensor 41a and the value (I2−$\alpha$). The loop current $\alpha$ is determined in advance and, for example, may be determined as a fixed value, may be determined to increase its absolute value with an increase in state of charge SOC of the battery 36, or may be determined to increase its absolute value with an increase in regenerative power of the motor 32. In one case, it is assumed that the regenerative currents I1 and I2 in the case of the ordinary control are both equal to −50 [A] and that the loop current $\alpha$ is equal to −150 [A]. In this case, the reactor current I11 becomes equal to −200 [A] and the reactor current IL2 becomes equal to 100 [A]. FIG. 4 illustrates one example of time changes of the reactor currents IL1 and IL2 in this case. A smoothing process is performed to avoid abrupt changes of the reactor current IL1 and IL2 in the case of FIG. 4. The loop current $\alpha$ is an electric current flowing in the transistor T11, the reactor L1, the reactor L2, the transistor T21 or the diode D21, and the transistor T11 in this sequence. Flowing the loop current $\alpha$ in the closed circuit consumes electric power with increasing a copper loss of the resistance components and an iron loss of the reactor components in the first and the second boost converters 40 and 41. This accordingly reduces the charging power of the battery 36 and suppresses the battery 36 from being overcharged.

When the state of charge SOC of the battery 36 reaches or exceeds the reference value Sref that is close to the full charge level during regenerative control of the motor 32, the electric vehicle 20 equipped with the power supply device according to the embodiment described above performs control to cause the loop current α, in addition to the electric currents in the case of the ordinary control, to flow in the closed circuit including the first boost converter 40 and the second boost converter 41. This configuration reduces the charging power of the battery 36 and suppresses the battery 36 from being overcharged.

According to the above embodiment, the loop current α is the electric current flowing in the transistor T11, the reactor L1, the reactor L2, the transistor T21 or the diode D21, and the transistor T11 in this sequence. According to a modification, the loop current α may be an electric current flowing in a reverse direction, i.e., flowing in the transistor T21, the reactor L2, the reactor L1, the transistor T11 or the diode D11, and the transistor T21 in this sequence.

The above embodiment determines the loop current α, performs the feedback control of the duty ratio of the first boost converter 40 to minimize the difference between the current value detected by the current sensor 40a and the value (I1+α), and performs the feedback control of the duty ratio of the second boost converter 41 to minimize the difference between the current value detected by the current sensor 41a and the value (I2−α). As long as the control enables the loop current to flow in the closed circuit including the first boost converter 40 and the second boost converter 41, a modification may control the first boost converter 40 and the second boost converter 41 to make the duty ratio of the first boost converter 40 larger (or smaller) than the duty ratio of the second boost converter 41 by a predetermined value. The same applies to the following controls.

Figure 5:
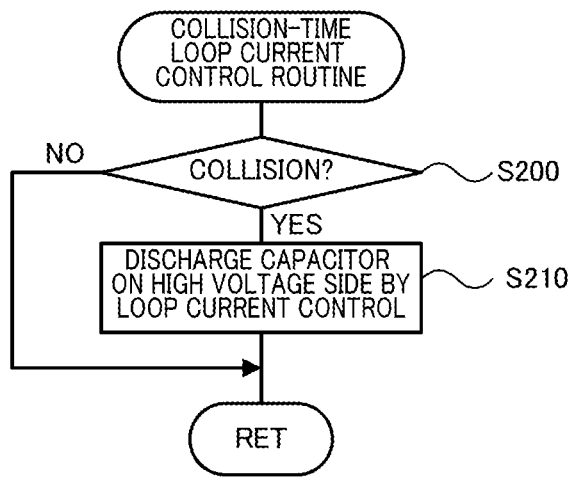
FIG. 5 is a flowchart showing one example of a collision-time loop current control routine performed by the electronic control unit.

The following describes the case where a loop current α is made to flow in the closed circuit including the first boost converter 40 and the second boost converter 41 when the electric vehicle 20 comes into collision. FIG. 5 is a flowchart showing one example of a collision-time loop current control routine performed by the electronic control unit 70 to cause the loop current α to flow in the closed circuit and thereby discharge the capacitor 46 on the high voltage side when the electric vehicle 20 comes into collision. This routine is performed repeatedly at every predetermined time interval (for example, at every several msec or at every several ten msec).

When the collision-time loop current control routine is triggered, the electronic control unit 70 first detects the occurrence or non-occurrence of a collision (step S200). The collision detection may be, for example, based on an acceleration from an acceleration sensor (not shown) or based on an impact from an impact sensor (not shown). The detection of step S200 may be performed by reading a collision determination flag that is set to a value 1 when the collision detection detects the occurrence of a collision. When non-occurrence of a collision is detected, the electronic control unit 70 determines that there is no need to discharge the capacitor 46 and terminates this routine.

When the occurrence of a collision is detected at step S200, the electronic control unit 70 controls the first boost converter 40 and the second boost converter 41 to cause a loop current α to flow in the closed circuit including the first and the second boost converters 40 and 41, with a view to discharging the capacitor 46 on the high voltage side (step S210) and then terminates this routine. The loop current α is a current value to discharge the capacitor 46 within one second and may be determined as a fixed value according to a maximum value of the voltage VH of the high voltage-side power lines 42 or may be determined based on the voltage of the capacitor 46 in the event of a collision. In the event of a collision, the system main relay 38 placed between the battery 36 and the first and the second boost converters 40 and 41 is turned off (to cut off the battery 36). The first and the second boost converters 40 and 41 are accordingly controlled to cause only the loop current α to flow in the closed circuit. The loop current α may be an electric current flowing in the transistor T11, the reactor L1, the reactor L2, the transistor T21 or the diode D21, and the transistor T11 in this sequence or may be an electric current flowing in a reverse direction, i.e., flowing in the transistor T21, the reactor L2, the reactor L1, the transistor T11 or the diode D11, and the transistor T21 in this sequence. Flowing the loop current α in the closed circuit consumes electric power by a copper loss of the resistance components and an iron loss of the reactor components in the first and the second boost converters 40 and 41. This accordingly enables the capacitor 46 to be discharged within a short time period.

In the event of a collision, the electric vehicle 20 equipped with the power supply device according to the embodiment described above controls the first boost converter 40 and the second boost converter 41 to cause the loop current α to flow in the closed circuit including the first and the second boost converters 40 and 41. This enables the capacitor 46 on the high voltage side to be discharged within a short time period.

The above embodiment controls the first boost converter 40 and the second boost converter 41 to cause the loop current α to flow in the closed circuit including the first and the second boost converters 40 and 41 in the event of a collision. Another available technique to discharge the capacitor 46 on the high voltage side within a short time period controls the inverter 34 to cause a d-axis current to flow in the motor 32. In the event of a collision, the control that causes the d-axis current to flow in the motor 32 may be used in combination with the control of the embodiment that causes the loop current α to flow in the closed circuit.

Figure 6:
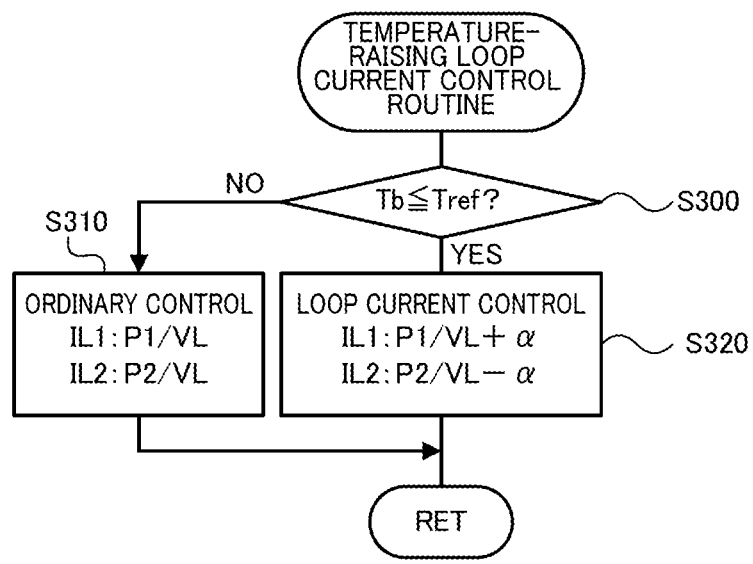
FIG. 6 is a flowchart showing one example of a temperature-raising loop current control routine performed by the electronic control unit.

The following describes the case where a loop current α is made to flow in the closed circuit including the first boost converter 40 and the second boost converter 41 when the temperature of the battery 36 is raised in an extremely low temperature condition such as the ambient temperature of −10° C. or −20° C. FIG. 6 is a flowchart showing one example of a temperature-raising loop current control routine performed by the electronic control unit 70 to cause the loop current α to flow in the closed circuit in the extremely low temperature condition and accelerate a temperature rise of the battery 36. This routine is performed at a system start time.

When the temperature-raising loop current control routine is triggered, the electronic control unit 70 first determines whether the temperature Tb of the battery 36 (battery temperature Tb) is equal to or lower than a reference value Tref (step S300). The reference value Tref is determined in advance according to the configuration of the battery 36 as an upper limit temperature that requires a temperature rise of the battery 36, and may be, for example, set to −10° C. or −20° C. When it is determined that the battery temperature Tb is higher than the reference value Tref, the electronic control unit 70 determines that there is no need to raise the temperature of the battery 36, controls the first boost converter 40 and the second boost converter 41 by ordinary control (step S310) and then terminates this routine. As described above, the ordinary control controls the first boost converter 40 to supply the required distributed power P1 to the high voltage-side power lines 42 or more specifically to cause an electric current I1 by dividing the required distributed power P1 by the voltage VL (I1=P1/VL) to be equal to an electric current IL1 flowing in the reactor L1 (reactor current IL1). The ordinary control also controls the second boost converter 41 to supply the required distributed power P2 to the high voltage-side power lines 42 or more specifically to cause an electric current I2 by dividing the required distributed power P2 by the voltage VL (I2=P2/VL) to be equal to an electric current IL2 flowing in the reactor L2 (reactor current IL2).

When it is determined at step S300 that the battery temperature Tb is equal to or lower than the reference value Tref, the electronic control unit 70 performs control to cause a loop current α, in addition to the electric currents I1 and I2 in the case of the ordinary control, to flow in the closed circuit including the first boost converter 40 and the second boost converter 41 (step S320) and then terminates this routine. More specifically, the first boost converter 40 is controlled to cause the reactor current IL1 to be equal to a value (P1/VL+α) obtained by adding the loop current α to the electric current I1 (I1=P1/VL) in the case of the ordinary control. The second boost converter 41 is controlled, on the other hand, to cause the reactor current IL2 to be equal to a value (P2/VL−α) obtained by subtracting the loop current α from the electric current I2 (I2=P2/VL) in the case of the ordinary control. These controls may be achieved by controlling the duty ratios of the first and the second boost converters 40 and 41 to minimize differences between the current values detected by the current sensors 40a and 41a and target reactor currents IL1 and IL2. The loop current α is determined in advance and may be, for example, a fixed value. In one case, it is assumed that the electric currents I1 and I2 in the case of the ordinary control are both equal to 50 [A] and that the loop current α is equal to 150 [A]. In this case, the reactor current IL1 becomes equal to 200 [A] and the reactor current IL2 becomes equal to −100 [A]. In this case, the loop current α is an electric current flowing in the reactor L1, the transistor T11 or the diode D11, the transistor T21, the reactor L2, and the reactor L1 in this sequence. Flowing the loop current α in the closed circuit increases a copper loss of the resistance components and an iron loss of the reactor components in the first and the second boost converters 40 and 41. This accordingly increases the discharge current from the battery 36 and accelerates a temperature rise of the battery 36.

When the battery temperature Tb is equal to or lower than the reference value Tref at a system start time, the electric vehicle 20 equipped with the power supply device according to the embodiment described above performs control to cause the loop current α, in addition to the electric currents in the case of the ordinary control, to flow in the closed circuit including the first boost converter 40 and the second boost converter 41. This configuration increases the discharge current from the battery 36 and accelerates a temperature rise of the battery 36.

According to the above embodiment, the loop current α is the electric current flowing in the reactor L1, the transistor T11 or the diode D11, the transistor T21, the reactor L2, and the reactor L1 in this sequence. According to a modification, the loop current α may be an electric current flowing in a reverse direction, i.e., flowing in the reactor L2, the transistor T21 or the diode D21, the transistor T11, the reactor L1, and the reactor L2 in this sequence.

Figure 7:
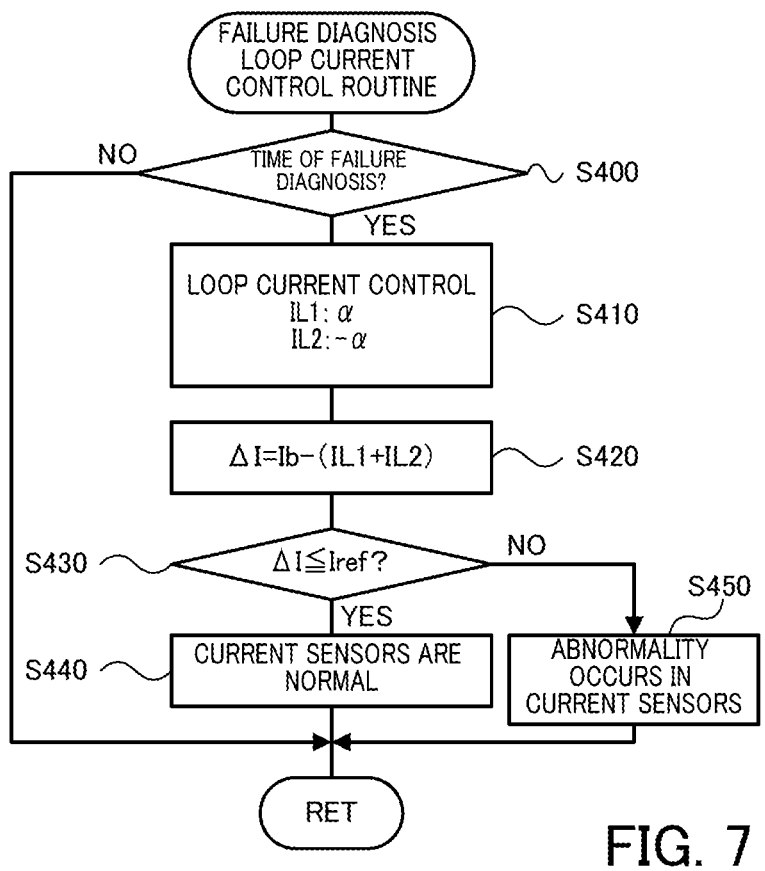
FIG. 7 is a flowchart showing one example of a failure diagnosis loop current control routine performed by the electronic control unit.

The following describes the case where a loop current α is made to flow in the closed circuit including the first boost converter 40 and the second boost converter 41 when a failure diagnosis is made for the current sensors 40a and 41a. FIG. 7 is a flowchart showing one example of a failure diagnosis loop current control routine performed by the electronic control unit 70 when a failure diagnosis is made for the current sensors 40a and 41a. This routine is performed at the time of a failure diagnosis.

When the failure diagnosis loop current control routine is triggered, the electronic control unit 70 determines whether the present time is the time of a failure diagnosis (step S400). When it is determined that the present time is not the time of a failure diagnosis, the electronic control unit 70 terminates this routine. When it is determined that the present time is the time of a failure diagnosis, on the other hand, the electronic control unit 70 controls the first boost converter 40 and the second boost converter 41 to make an electric current IL1 flowing in the reactor L1 (reactor current IL1) equal to α and to make an electric current IL2 flowing in the reactor L2 (reactor current IL2) equal to −α (step S410). When α is a positive value, the loop current α is an electric current flowing in the reactor L1, the transistor T11 or the diode D11, the transistor T21, the reactor L2, and the reactor L1 in this sequence. When α is a negative value, the loop current α is an electric current flowing in the reactor L2, the transistor T21 or the diode D21, the transistor T11, the reactor L1, and the reactor L2 in this sequence.

The electronic control unit 70 subsequently calculates an electric current difference ΔI by subtracting a sum (IL1+IL2) of the reactor current IL1 and the reactor current IL2 from the battery current Ib detected by the current sensor 36b (step S420) and determines whether the electric current difference ΔI is equal to or less than a reference value Iref (step S430). The reference value Iref may be set to a sum of tolerances of the current sensor 36b and the current sensors 40a and 41a or a slightly larger value than the sum of tolerance. Flowing the loop current α causes an electric power corresponding to losses in the first and the second boost converters 40 and 41 to be discharged from the battery 36. This causes the electric current Ib in the course of discharging the battery 36 to be equal to the sum (IL1+IL2) of the reactor current IL1 and the reactor current IL2 and allows for determination of whether any abnormality occurs in the current sensors 40a and 41a. When the electric current difference ΔI is equal to or less than the reference value Iref, the electronic control unit 70 determines that the current sensors 40a and 41a are normal (step S440) and then terminates this routine. When the electric current difference ΔI is larger than the reference value Iref, on the other hand, the electronic control unit 70 determines that an abnormality occurs in one of or in both the current sensors 40a and 41a (step S450) and then terminates this routine.

The electric vehicle 20 equipped with the power supply device according to the embodiment described above controls the first boost converter 40 and the second boost converter 41 to cause the loop current α to flow in the closed circuit including the first and the second boost converters 40 and 41 at the time of a failure diagnosis and thereby makes a diagnosis to determine whether any abnormality occurs in the current sensors 40a and 41a.

It is preferable to change the value of the loop current α and to make a failure diagnosis for the current sensors 40a and 41a a plurality of times with regard to the respective values of the loop current α.

As described above with reference to the loop current control routines of FIG. 3 and FIGS. 5 to 7, the electric vehicle 20 equipped with the power supply device according to the embodiment causes the loop current α to flow in the closed circuit including the first boost converter 40 and the second boost converter 41 as needed basis, based on the state of the electric vehicle 20 with the power supply device mounted thereon.

The power supply device mounted on the electric vehicle 20 of the embodiment is equipped with two boost converters, i.e., the first boost converter 40 and the second boost converter 41. According to a modification, the power supply device may be equipped with three or more boost converters.

The power supply device mounted on the electric vehicle 20 of the embodiment is equipped with one battery 36 as the power storage device. The power storage device may be a capacitor used in place of the battery 36.

The embodiment describes the configuration of the power supply device mounted on the electric vehicle 20 that is driven with power from the motor 32. The present disclosure may also be implemented by the configuration of a power supply device mounted on a hybrid vehicle that is driven with the power from a motor and the power from an engine or by the configuration of a power supply device built in stationary equipment such as construction equipment.

In the power supply device of this aspect, at the predetermined time, the control device may control the first boost converter such that a first target distributed current, which is obtained by adding the loop current to a first distributed current that is to be flowed by the first boost converter out of a target current that is to be flowed between the electric load and the power storage device, flows in the first boost converter, and may control the second boost converter such that a second target distributed current, which is obtained by subtracting the loop current from a second distributed current that is to be flowed by the second boost converter out of the target current, flows in the second boost converter. This configuration ensures the flow of a target current that is to be flowed between the electric load and the power storage device, while causing the loop current to flow in the closed circuit including the first boost converter and the second boost converter.

In the power supply device of this aspect, the first boost converter and the second boost converter may be configured as converters of an identical performance, and the control device may perform the loop current control to cause a duty ratio of the first boost converter to be higher than a duty ratio of the second boost converter. This configuration causes the loop current to flow in the first boost converter from the power storage device side to the electric load side, while causing the loop current to flow in the second boost converter from the electric load side to the power storage device side. In this aspect, the loop current increases with an increase in difference between the duty ratio of the first boost converter and the duty ratio of the second boost converter.

In the power supply device of this aspect, the predetermined time may be a time of supply of electric power from the electric load side when a state of charge of the power storage device is equal to or higher than a predetermined level. Flowing the loop current in the closed circuit including the first boost converter and the second boost converter increases losses and thereby reduces the charging power of the power storage device. As a result, this suppresses the power storage device from being overcharged.

In the power supply device of this aspect, the predetermined time may be a time of abrupt discharge of electric charges from the second capacitor. For example, there may be a need to abruptly discharge electric charges from the second capacitor, depending on the state of the system which the power supply device is built in. In this case, the loop current is made to flow in the closed circuit including the first boost converter and the second boost converter. This configuration increases power losses of the two boost converters and causes electric power to be consumed by the two boost converters. This accordingly enables electric charges to be abruptly discharged from the second capacitor.

In the power supply device of this aspect, the predetermined time may be a time of a temperature rise of the power storage device. There is a need to raise the temperature of the power storage device in an extremely low temperature condition. In this case, the loop current is made to flow in the closed circuit including the first boost converter and the second boost converter. This configuration increases the electric current output from the power storage device and accelerates a temperature rise of the power storage device.

The power supply device of the above aspect may further comprise a first current sensor configured to detect an electric current flowing in the first boost converter; and a second current sensor configured to detect an electric current flowing in the second boost converter. The predetermined time may be a time of a failure diagnosis made for the first current sensor and the second current sensor. In the failure diagnosis for the first current sensor and the second current sensor, a high electric current or a low electric current needs to be flowed in the first boost converter or in the second boost converter. The configuration that causes the loop current to flow in the closed circuit including the first boost converter and the second boost converter and adjusts the loop current freely changes the electric currents flowing in the first boost converter and in the second boost converter and accordingly enables the failure diagnosis to be made more appropriately for the first current sensor and the second current sensor.

The following describes the correspondence relationship between the primary components of the embodiment and the primary components of the disclosure described in Summary. The battery 36 of the embodiment corresponds to the "power storage device", the first boost converter 40 corresponds to the "first boost converter", the second boost converter 41 corresponds to the "second boost converter", the capacitor 48 corresponds to the "first capacitor", the capacitor 46 corresponds to the "second capacitor", and the electronic control unit 70 corresponds to the "control device". The motor 32 and the inverter 34 correspond to the "electric load".

The correspondence relationship between the primary components of the embodiment and the primary components of the disclosure, regarding which the problem is described in Summary, should not be considered to limit the components of the disclosure, regarding which the problem is described in Summary, since the embodiment is only illustrative to specifically describes the aspects of the disclosure, regarding which the problem is described in Summary. In other words, the disclosure, regarding which the problem is described in Summary, should be interpreted on the basis of the description in the Summary, and the embodiment is only a specific example of the disclosure, regarding which the problem is described in Summary.

The aspect of the disclosure is described above with reference to the embodiment. The disclosure is, however, not limited to the above embodiment but various modifications and variations may be made to the embodiment without departing from the scope of the disclosure.

INDUSTRIAL APPLICABILITY

The technique of the disclosure is preferably applicable to the manufacturing industries of the power supply device and so on.

The invention claimed is:

1. A power supply device, comprising:
   a power storage device;
   a first boost converter configured to transmit electric power with conversion of a voltage between an electric load side and a power storage device side;
   a second boost converter connected in parallel to the first boost converter relative to an electric load and configured to transmit electric power with conversion of a voltage between the electric load side and the power storage side;
   a first capacitor placed on the power storage device side of the first boost converter and the second boost converter;
   a second capacitor placed on the electric load side of the first boost converter and the second boost converter; and
   a control device configured to control the first boost converter and the second boost converter, wherein
   at a predetermined time, the control device performs a loop current control that controls the first boost converter and the second boost converter such that a loop current flows in a closed circuit including the first boost converter and the second boost converter, and
   during the loop current control, a direction of an electric current flowing in the first boost converter is opposite to a direction of an electric current flowing in the second boost converter.

2. The power supply device according to claim 1, wherein at the predetermined time, the control device controls the first boost converter such that a first target distributed current, which is obtained by adding the loop current to a first distributed current that is to be flowed by the first boost converter out of a target current that is to be flowed between the electric load and the power storage device, flows in the first boost converter, and controls the second boost converter such that a second target distributed current, which is obtained by subtracting the loop current from a second distributed current that is to be flowed by the second boost converter out of the target current, flows in the second boost converter.

3. The power supply device according to claim 1, wherein the first boost converter and the second boost converter are configured as converters of an identical performance, and
   the control device performs the loop current control to cause a duty ratio of the first boost converter to be higher than a duty ratio of the second boost converter.

4. The power supply device according to claim 1, wherein the predetermined time is a time of supply of electric power from the electric load side when a state of charge of the power storage device is equal to or higher than a predetermined level.

5. The power supply device according to claim 1, wherein the predetermined time is a time of abrupt discharge of electric charges from the second capacitor.

6. The power supply device according to claim 1, wherein the predetermined time is a time of a temperature rise of the power storage device.

7. The power supply device according to claim 1, further comprising:
   a first current sensor configured to detect an electric current flowing in the first boost converter; and
   a second current sensor configured to detect an electric current flowing in the second boost converter, wherein
   the predetermined time is a time of a failure diagnosis that is made for the first current sensor and the second current sensor.

8. The power supply device according to claim 1, wherein the loop current flows through a switch of the first boost converter and a switch or diode of the second boost converter.

* * * * *